(12) United States Patent
Saklang et al.

(10) Patent No.: US 12,125,771 B2
(45) Date of Patent: Oct. 22, 2024

(54) SEMICONDUCTOR PACKAGE HAVING LEAD FRAME WITH SEMICONDUCTOR DIE AND COMPONENT MODULE MOUNTED ON OPPOSITE SURFACES OF THE LEAD FRAME AND METHODS OF MANUFACTURE THEREOF

(71) Applicant: NXP B.V., Eindhoven (NL)

(72) Inventors: Chayathorn Saklang, Bangplee (TH); Chanon Suwankasab, Pathumthani (TH); Amornthep Saiyajitara, Bangken (TH); Verapath Vareesantichai, Bangkok (TH)

(73) Assignee: NXP B.V., Eindhoven (NL)

( * ) Notice: Subject to any disclaimer, the term of this patent is extended or adjusted under 35 U.S.C. 154(b) by 419 days.

(21) Appl. No.: 17/643,193

(22) Filed: Dec. 8, 2021

(65) Prior Publication Data

US 2023/0178457 A1 Jun. 8, 2023

(51) Int. Cl.
*H01L 23/495* (2006.01)
*H01L 23/00* (2006.01)
*H01L 23/31* (2006.01)

(52) U.S. Cl.
CPC .... *H01L 23/49503* (2013.01); *H01L 23/3107* (2013.01); *H01L 23/49593* (2013.01);
(Continued)

(58) Field of Classification Search
CPC ............. H01L 24/32; H01L 23/49503; H01L 23/3107; H01L 24/29; H01L 23/49593; H01L 23/49531; H01L 24/83; H01L 24/73; H01L 24/48; H01L 24/81; H01L 24/17; H01L 23/49575; H01L 21/56; H01L 23/49551; H01L 23/49541; H01L 23/4951; H01L 23/28; H01L 23/49838; H01L 23/4952; H01L 23/49582; H01L 23/49572; H01L 23/645; H01L 21/565; H01L 28/10; H01L 21/4825; H01L 23/495; H01L 23/49537; H01L 23/49513; H01L 23/3114;
(Continued)

(56) References Cited

U.S. PATENT DOCUMENTS 5,012,323 A * 4/1991 Farnworth .......... H01L 23/4951
257/676
5,689,135 A * 11/1997 Ball .................. H01L 23/49575
257/676
(Continued)

FOREIGN PATENT DOCUMENTS

| CN | 102576702 B | 11/2015 |
|---|---|---|
| JP | S61014731 A | 1/1986 |
| JP | H01282853 A | 11/1989 |

*Primary Examiner* — Mouloucoulaye Inoussa

(57) ABSTRACT

A semiconductor package comprises a leadframe, a component module, and a semiconductor die. The leadframe has a plurality of insertion terminals, a split die pad, and one or more leads. The component module has one or more passive components mounted on a substrate. The semiconductor die has an integrated circuit. The component module is mounted on a split die pad at a first surface of the leadframe and forms an electrical connection with the insertion terminals. Further, the semiconductor die is mounted on the split die pad at a second surface of the leadframe which is opposite to the first surface.

20 Claims, 5 Drawing Sheets

(52) U.S. Cl.
CPC .............. *H01L 24/29* (2013.01); *H01L 24/32* (2013.01); *H01L 24/83* (2013.01); *H01L 24/48* (2013.01); *H01L 24/73* (2013.01); *H01L 2224/2919* (2013.01); *H01L 2224/32245* (2013.01); *H01L 2224/48245* (2013.01); *H01L 2224/73265* (2013.01); *H01L 2224/83385* (2013.01)

(58) Field of Classification Search
CPC ........... H01L 25/50; H01L 2224/32245; H01L 2224/83385; H01L 2224/48245; H01L 2224/2919; H01L 2224/73265; H01L 2224/16245; H01L 2924/181; H01L 2224/48091; H01L 2924/18161; H01L 2224/48247; H01L 2924/00014; H01L 2924/00012; H01L 2924/1206; H01L 2924/19042; H01L 2924/1207; H01L 2924/1432; H01L 2924/15311; H01L 2924/19043; H02M 3/158; H01F 27/292; H01F 27/29; H01F 27/255; H01F 1/36; H01F 27/027; H01F 1/14766; H01F 2027/295; H05K 1/181; H05K 3/3436; H05K 2201/10159; H05K 2201/10734
USPC ....... 257/675, 676, 686, 685, 777, 775, 107, 257/690, 724, 784, 779, 780, E21.52, 257/E23.169, E23.052, E23.124, E23.044; 438/109, 127, 123, 112
See application file for complete search history.

(56) References Cited

U.S. PATENT DOCUMENTS

| | | | |
|---|---|---|---|
| 6,531,784 B1* | 3/2003 | Shim ...................... H01L 24/48 | 257/784 |
| 8,994,157 B1 | 3/2015 | Kiew | |
| 11,562,949 B2* | 1/2023 | Thompson ............... H01L 24/81 | |
| 2002/0195624 A1* | 12/2002 | Glenn .................. H01L 25/0657 | 257/200 |
| 2004/0094826 A1 | 5/2004 | Yang et al. | |
| 2006/0164818 A1 | 7/2006 | Mandel et al. | |
| 2007/0132079 A1* | 6/2007 | Otremba ............. H01L 23/3107 | 257/E23.044 |
| 2010/0127361 A1* | 5/2010 | Kuan .................... H01L 21/565 | 438/112 |
| 2010/0133674 A1* | 6/2010 | Hebert ............. H01L 23/49575 | 438/109 |
| 2010/0176497 A1* | 7/2010 | Merilo ................ H01L 23/3128 | 257/668 |
| 2011/0024884 A1* | 2/2011 | Xue ........................ H01L 24/39 | 257/676 |
| 2012/0326287 A1* | 12/2012 | Joshi ....................... H01L 21/56 | 257/676 |
| 2013/0027113 A1* | 1/2013 | Otremba .................. H01L 24/84 | 257/E21.705 |
| 2013/0069163 A1* | 3/2013 | Bhalla ................... H01L 25/074 | 257/777 |
| 2013/0181332 A1* | 7/2013 | Kelkar ................ H01L 23/3107 | 257/E23.051 |
| 2013/0228794 A1* | 9/2013 | Cho ........................ H01L 24/84 | 257/676 |
| 2013/0285260 A1* | 10/2013 | Denison ............ H01L 23/49575 | 257/777 |
| 2014/0264804 A1* | 9/2014 | Terrill ...................... H01L 24/36 | 257/676 |
| 2014/0273344 A1* | 9/2014 | Terrill ...................... H01L 24/92 | 438/107 |
| 2015/0357269 A1* | 12/2015 | Im ....................... H01L 25/0657 | 257/676 |
| 2016/0260697 A1* | 9/2016 | Cho ......................... H01L 24/41 | |
| 2018/0190776 A1* | 7/2018 | Gogineni ................. H01L 24/49 | |
| 2019/0067171 A1* | 2/2019 | Estacio ............. H01L 23/49531 | |
| 2020/0194357 A1* | 6/2020 | Shibuya ............ H01L 23/49524 | |
| 2020/0227393 A1 | 7/2020 | Kim et al. | |
| 2021/0043551 A1* | 2/2021 | Kim .................. H01L 23/49551 | |
| 2021/0066245 A1* | 3/2021 | Ahn .................... H01L 25/0657 | |
| 2021/0313283 A1* | 10/2021 | Wilson ..................... H01L 24/48 | |
| 2021/0375730 A1* | 12/2021 | Shibuya ............ H01L 23/49562 | |
| 2021/0398882 A1* | 12/2021 | Thompson .............. H01L 21/56 | |

\* cited by examiner

SEMICONDUCTOR PACKAGE HAVING LEAD FRAME WITH SEMICONDUCTOR DIE AND COMPONENT MODULE MOUNTED ON OPPOSITE SURFACES OF THE LEAD FRAME AND METHODS OF MANUFACTURE THEREOF

TECHNICAL FIELD

Embodiments of the subject matter described herein relate generally to a semiconductor package having a lead frame with semiconductor die and component module mounted on opposite surfaces of the lead frame and methods of manufacture thereof.

BACKGROUND

A lead frame has a die pad for mounting a semiconductor die and leads surrounding the die pad. Each lead ends at respective die bond pad and bond wires connect the die to the respective bond pads. The lead frame is made of a conductive material such as copper or an alloy and customized with a conductive pattern to which passive components are directly mounted using materials such as a silver palladium alloy to form a circuit of the passive components. The lead frame also includes insertion terminals integrated with the conductive pattern. A portion of the lead frame is encapsulated with an encapsulant to form a semiconductor package and the insertion terminals inserted into a socket, through hole, or crimping mount which accepts the insertion terminals. The passive components facilitate filtering of signals between the semiconductor die of semiconductor package and circuitry coupled to the socket, through hole, or crimping mount which accepts the insertion terminals.

BRIEF DESCRIPTION OF THE DRAWINGS

A complete understanding of the subject matter may be derived by referring to the detailed description and claims when considered in conjunction with the following figures, wherein like reference numbers refer to similar elements throughout the figures.

DETAILED DESCRIPTION

Embodiments disclosed herein are directed to a semiconductor package having a lead frame with semiconductor die and component module mounted on opposite surfaces of the lead frame and methods of manufacture thereof. A semiconductor die is mounted on a split die pad of the lead frame on one surface of the lead frame and the component module is mounted on the split die pad on the other surface of the lead frame. The component module mounted on the other surface of the lead frame includes a substrate such as a printed circuit board on which passive components is mounted and coupled together by electrical connections such as traces on the substrate to form a circuit. The component module is further electrically coupled to the split die pad. A portion of the lead frame including the semiconductor die and the component module is encapsulated with an encapsulant such as a thermoplastic epoxy to form the semiconductor package. Well known structures and techniques have not been shown in detail in order not to obfuscate the description.

Figure 1A:
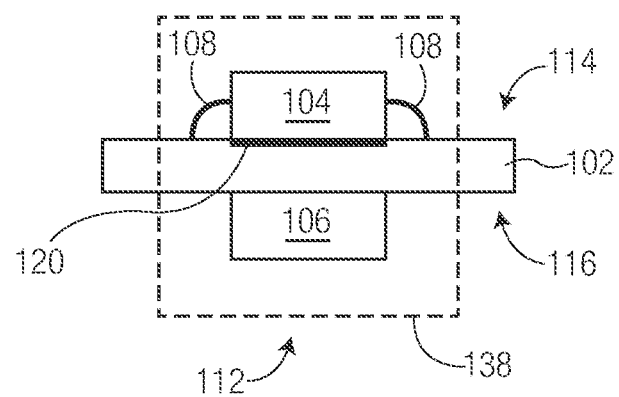
FIGS. 1A-1B show respectively an example cross section view of an example semiconductor package and example surfaces of a simplified leadframe in the example semiconductor package according to an embodiment.
Figure 1B:
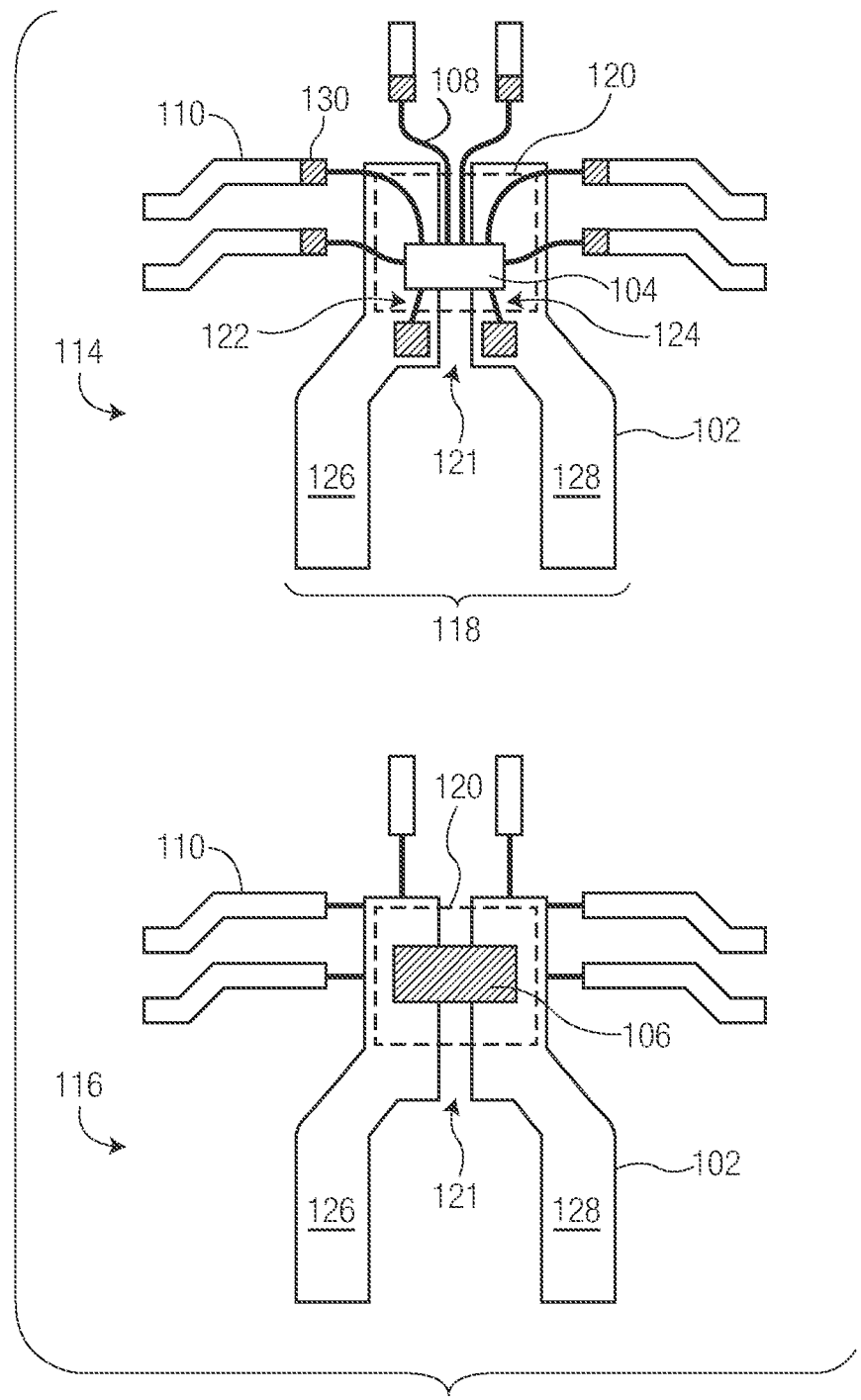

FIGS. 1A-1B show respectively an example cross section view of an example semiconductor package and example surfaces of a simplified leadframe in the example semiconductor package according to an embodiment. The lead frame 102 may include a first surface 114 and an opposite second surface 116 which are planar surfaces of the lead frame 102. In an example, the leadframe 102 may be made of a conductive material such as copper, aluminum, or an alloy. Further, the lead frame 102 may have a plurality of leads 110 and insertion terminals 118. In an example, six leads 110 are shown which terminate around a split die pad 120 of the leadframe 102 outlined by a dotted line. In an example, the leads 110 may be electrically coupled by a soldering or other process to a printed circuit board (not shown) or other substrate on which the semiconductor package 112 is mounted. The split die pad 120 may be split by a gap 121 of the leadframe 102 to form a first die pad side 122 and second die pad side 124, respectively, which are electrically isolated by a non-conductive material. The non-conductive material may be air before encapsulation and an encapsulant after encapsulation as described below. The split die pad 120 may support a semiconductor die 104. In an example, the semiconductor die 104 may be mounted on the split die pad 120 on a first surface 114 of the leadframe 102 and attached, for example, with a non-conductive adhesive such as an epoxy or adhesive tape. The semiconductor die 104 may be an integrated circuit such as a microprocessor that performs general processing or a dedicated circuit that performs a specific application such as motion sensing, pressure sensing, or speed sensing as examples. The leads 110 that terminate around the split die pad 120 may have respective bond pads 130. In an example, the semiconductor die 104 may be connected to the leads 110 by respective wires 108 from the semiconductor die 104 to the bond pads 130 on the leads 110. In an example, the insertion terminals 118 may include a first insertion terminal 126 and a second insertion terminal 128 which are integrated with the first die pad side 122 and second die pad side 124, respectively. In an example, the insertion terminals 118 may be arranged to be inserted in an insertion socket, through hole, or crimping mount (all not shown) which accepts the insertion terminals 118. The insertion socket, through hole, or crimping mount may be located on the printed circuit board or other substrate which the semiconductor package 112 is mounted on and further electrically coupled to additional circuitry such as a bus structure. The bus structure may allow communication between the semiconductor die 104 and yet additional circuitry coupled to the bus structure. In an example, the communication may include signals associated with the specific application of the integrated circuit and the yet additional circuitry may process the signals. Further, a wire 108 may be coupled between a bond pad of the insertion terminals 118 and the semiconductor die 104 to provide for an electrical connection between the insertion terminals 118 to the semiconductor die 104. The semiconductor die 104 may receive or transmit signals via the insertion terminals 118 in an example.

Embodiments disclosed herein are directed to mounting a component module 106 on the second surface 116 of the leadframe 102 which is opposite the first surface 114. The component module 106 may include one or more passive components such as resistors, capacitors, or inductors. The component module 106 may be mounted on the split die pad 120 of the lead frame 102 by a conductive adhesive such as an epoxy, adhesive tape, or solder. In an example, the component module 106 may be mounted directly opposite the semiconductor die 104 on the second surface 116. In an example, the components 136 of the component module 106 may perform a filtering of signals applied to the insertion terminals 118 by one or more of the semiconductor die 104 and the additional circuitry which is coupled to the socket, through hole, or crimping mount which accepts the insertion terminals 118. At least a portion of the leadframe 102 including the semiconductor die 104 and the component module 106 may then be encapsulated with an encapsulant 138 by a plastic (e.g., thermoset, thermoplastic) outlined by a dotted line and a molding process to form the semiconductor package 112. In an example, the terminals 118 and the leads 110 may protrude from the encapsulant of the semiconductor package 112 to facilitate the electrical connections described above.

Figure 2:
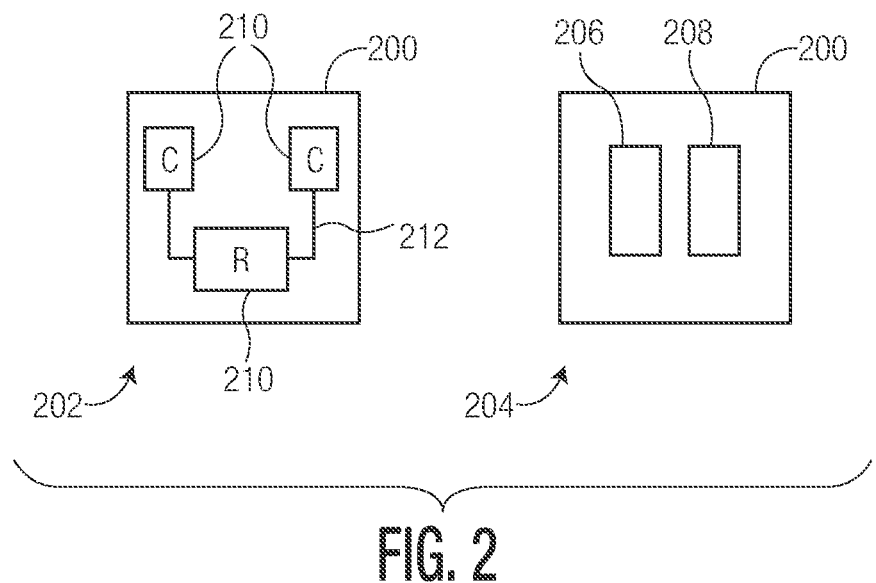
FIG. 2 is an example of a component module in accordance with an embodiment.

FIG. 2 is an example of the component module 106 in accordance with an embodiment. A substrate 200 of the component module 106 may have a first surface 202 and a second surface 204. The substrate 200 may be a printed circuit board (PCB) in an example with conductive traces 212 that form an example circuit of passive components 210 such as capacitors (C) or resistors (R). On the first surface 202, passive components 210 may be mounted. Further, on the second surface 204, the substrate 200 may have one or more electrical connections. In an example, one electrical connection 206 may be electrically coupled to the insertion terminal 126 and another electrical connection 208 may be electrically coupled to the insertion terminal 128 when the component module 106 is mounted over the split die 120 on the second surface 116 of the leadframe 102 opposite to where the semiconductor die 104 is mounted. In an example, the passive components 210 may perform a filtering of signals applied to the insertion terminals 118.

The mounting of the component module 106 as described herein reduces a size of the semiconductor package 112 compared to directly mounting passive components on a conductive pattern on a leadframe and mounting the passive components on a same surface where a semiconductor die is mounted. Further, the arrangement disclosed herein allows for increasing density of the passive components 210 on the leadframe 102 compared to placing the passive components 136 directly on the conductive pattern of the leadframe 102 which limits a maximum density of passive components 210 on the leadframe 102. Additionally, the use of the component module 106 allows for different circuits of the passive components 210 to be realized and mounted to the leadframe 102 by changing the circuit on the substrate 200 and without having to change the conductive pattern of the leadframe 102 on which the passive components 210 would be otherwise directly mounted to. Still additionally, cost of materials to mount the component module 106 to the leadframe 102 may be less than cost to mount the passive components 136 directly to the leadframe. The component module 106 may be mounted to the leadframe 102 using a conductive epoxy, eutectic alloy, or solder which is less expensive than using materials such as a silver palladium alloy to mount the passive components 136 directly to the conductive pattern of the leadframe 102.

Figure 3A:
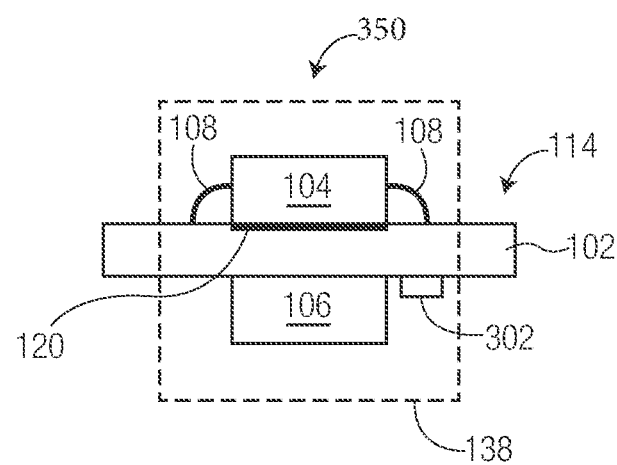
FIGS. 3A-3B show an example cross section view and example surfaces of a simplified leadframe in another example semiconductor package according to an embodiment.
Figure 3B:
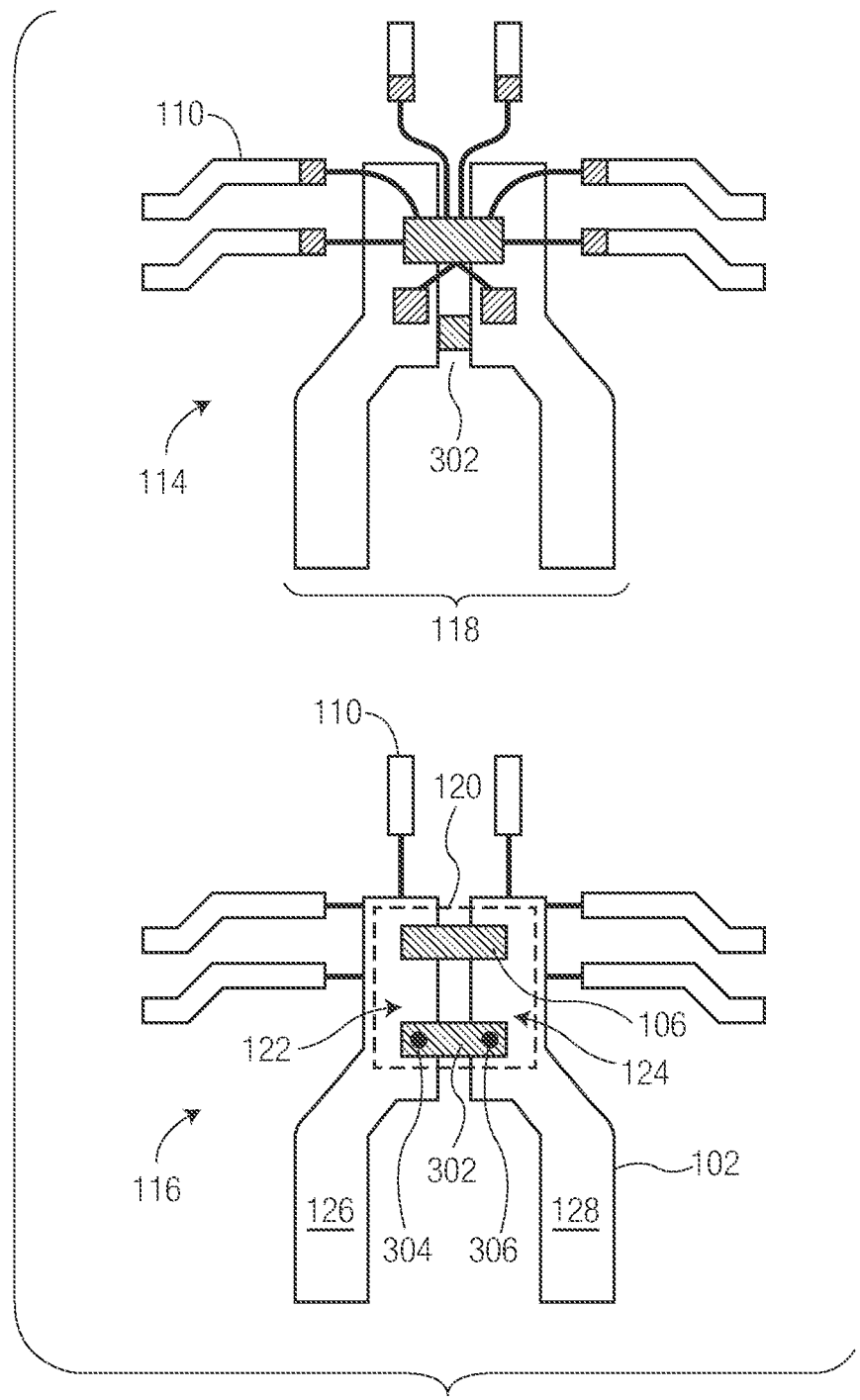

FIGS. 3A-3B show respectively an example cross section view and example surfaces of a simplified leadframe 102 in an example semiconductor package 350 according to an embodiment. The leadframe 102 may further accommodate a two pole component 302 such as a battery in addition to the component module 106. The two pole device 302 may be mounted across the split die pad 120. One pole 304 of the two pole device 202 may be coupled to the first die pad side 122 and another pole 306 may be coupled to the second die pad side 124 of the leadframe 102 where the component module 106 is also mounted. A portion of the leadframe 102 which includes the semiconductor die 104, the two pole component 302, and the component module 106 may then be encapsulated with an encapsulant 138. In an example, the leadframe 102 allows for increased density of components by including both the component module 106 and the two pole device 202 in the semiconductor package 350.

Figure 4:
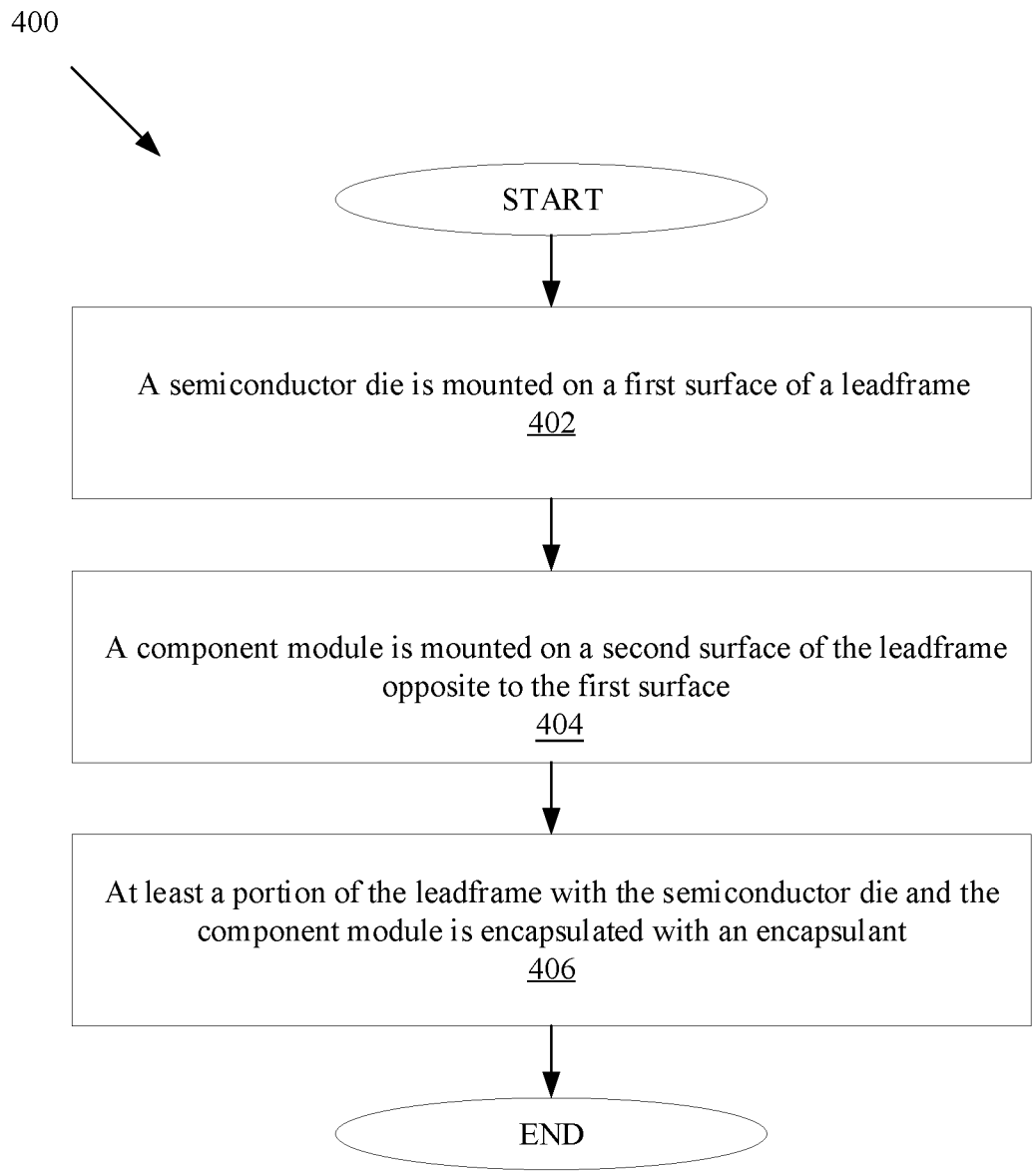
FIG. 4 is an example flow chart of functions associated with manufacturing the semiconductor package according to an embodiment.

FIG. 4 is an example flow chart 400 of functions associated with manufacture of the semiconductor package 112 according to an embodiment. At step 402, a semiconductor die 104 is mounted on a first surface 114 of a leadframe 102. In examples, the semiconductor die 104 may be coupled to leads 110 and insertion terminals 118 of the leadframe 102 by respective wires 108 from the semiconductor die 104 and affixed to bond pads 130 of the leads 110. The semiconductor die 104 may be mounted on a split die pad 120 of the leadframe 102 with a non-conductive adhesive in an example. At step 404, a component module 106 may be mounted on a second surface 116 of the leadframe 102 opposite to the first surface 114. The component module 106 may be mounted on a split die pad 120 of the leadframe 102 and affixed by a conductive adhesive to the leadframe 102. At step 406, at least a portion of the leadframe 102 with the semiconductor die 104 and the component module 106 is encapsulated with an encapsulant 138.

In one embodiment, a semiconductor package is disclosed. The semiconductor package comprises: a leadframe having a plurality of insertion terminals, a split die pad, and one or more leads; a component module having one or more passive components mounted on a substrate; a semiconductor die having an integrated circuit; wherein the component module is mounted on the split die pad at a first surface of the leadframe and forms an electrical connection with the insertion terminals and the semiconductor die is mounted on the split die pad at a second surface of the leadframe which is opposite to the first surface. In an embodiment, the substrate is a printed circuit board comprising the one or more passive components, the printed circuit board having with a first contact which forms a first electrical connection of the component module with a first die pad side of the split die pad and a second contact which forms a second electrical connection of the component module with a second die pad side of the split die pad. In an embodiment, the component module further comprises a conductive trace which couples the passive components to form a circuit of the passive components. In an embodiment, the semiconductor package further comprises a two pole component mounted on the split die pad, wherein a first electrical connection of the two pole component forms an electrical connection with a first die pad side of the split die pad and a second electrical connection of the two pole component forms a second electrical connection with a second die pad side of the split die pad. In an embodiment, the two pole component is a battery. In an embodiment, the passive components are configured as a circuit. In an embodiment, the split die pad has a first die pad side and a second die pad side separated by a gap of non-conductive material. In an embodiment, the semiconductor package further comprises an encapsulant which encapsulates the semiconductor die, the component module, and at least a portion of the leadframe. In an embodiment, the semiconductor package further comprises bond wires which form an electrical connection between the semiconductor die and respective bond pads of the one or more leads and the insertion leads. In an embodiment, the component module is mounted to the leadframe by a conductive adhesive. In an embodiment, the conductive adhesive is an epoxy. In an embodiment, the leadframe is a conductive metal or alloy.

In another embodiment, a method of assembling a semiconductor package is disclosed. The method comprises: mounting a component module having one or more passive components on a split die pad at a first surface of a leadframe, the leadframe having a plurality of insertion terminals, a split die pad, and one or more leads, the mounted component module forms an electrical connection between the insertion terminals and the component module; mounting a semiconductor die having an integrated circuit on a split die pad at a second surface of the leadframe which is opposite to the first surface; and encapsulating one or more of the component module and the semiconductor die with an encapsulant to form the semiconductor package. In an embodiment, the substrate is a printed circuit board comprising the one or more passive components, the printed circuit board having with a first contact which forms a first electrical connection of the component module with a first die pad side of the split die pad and a second contact which forms a second electrical connection of the component module with a second die pad side of the split die pad. In an embodiment, the method further comprises mounting a two pole component on the split die pad, wherein a first electrical connection of the two pole component forms an electrical connection with a first die pad side of the split die pad and a second electrical connection forms an electrical connection with a second die pad side of the split die pad. In an embodiment, the passive components are configured as a circuit. In an embodiment, the split die pad has a first die pad side and a second die pad side separated by a gap of non-conductive material. In an embodiment, encapsulating with the encapsulant comprises encapsulating at least a portion of the leadframe. In an embodiment, the method further comprises connecting bond wires between the semiconductor die and respective bond pads of the one or more leads and the respective insertion terminals to electrically connect the semiconductor die to the one or more leads and the insertion terminals. In an embodiment, mounting a component module comprises affixing the component module to the leadframe by a conductive adhesive.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

Although the operations of the method(s) herein are shown and described in a particular order, the order of the operations of each method may be altered so that certain operations may be performed in an inverse order or so that certain operations may be performed, at least in part, concurrently with other operations unless expressly indicated. In another embodiment, instructions or sub-operations of distinct operations may be implemented in an intermittent and/or alternating manner.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor package comprising:
    a leadframe having a plurality of insertion terminals, a split die pad, and one or more leads;
    a component module having one or more passive components mounted on a substrate;
    a semiconductor die having an integrated circuit;
    wherein the component module is mounted on the split die pad at a first surface of the leadframe and forms an electrical connection with the insertion terminals and the semiconductor die is mounted on the split die pad at a second surface of the leadframe which is opposite to the first surface;
    wherein the substrate is a printed circuit board (PCB) comprising the one or more passive components coupled by traces on the PCB; and
    wherein the insertion terminals are positioned along a same side of the semiconductor package and outside an encapsulant of the semiconductor package.

2. The semiconductor package of claim 1, wherein the printed circuit board has a first contact which forms a first electrical connection of the component module with a first die pad side of the split die pad and a second contact which forms a second electrical connection of the component module with a second die pad side of the split die pad.

3. The semiconductor package of claim 2, wherein the component module further comprises a conductive trace which couples the passive components to form a circuit of the passive components.

4. The semiconductor package of claim 2, further comprising a two pole component mounted on the split die pad, wherein a first electrical connection of the two pole component forms an electrical connection with a first die pad side of the split die pad and a second electrical connection of the two pole component forms a second electrical connection with a second die pad side of the split die pad.

5. The semiconductor package of claim 4, wherein the two pole component is a battery.

6. The semiconductor package of claim 1, wherein the passive components are configured as a circuit.

7. The semiconductor package of claim 1, wherein the split die pad has a first die pad side and a second die pad side separated by a gap of non-conductive material.

8. The semiconductor package of claim 1, further comprising encapsulant which encapsulates the semiconductor die, the component module, and at least a portion of the leadframe.

9. The semiconductor package of claim 1, further comprising bond wires which form an electrical connection between the semiconductor die and respective bond pads of the one or more leads and the insertion leads.

10. The semiconductor package of claim 1, wherein the component module is mounted to the leadframe by a conductive adhesive.

11. The semiconductor package of claim 10, wherein the conductive adhesive is an epoxy.

12. The semiconductor package of claim 1, wherein the leadframe is a conductive metal or alloy.

13. A method of assembling a semiconductor package comprising:
mounting a component module having one or more passive components on a split die pad at a first surface of a leadframe, the leadframe having a plurality of insertion terminals, the split die pad, and one or more leads, the mounted component module forms an electrical connection between the insertion terminals and the component module;
mounting a semiconductor die having an integrated circuit on the split die pad at a second surface of the leadframe which is opposite to the first surface;
encapsulating one or more of the component module and the semiconductor die with an encapsulant to form the semiconductor package;
wherein the substrate is a printed circuit board (PCB) comprising the one or more passive components coupled by traces on the PCB; and
wherein the insertion terminals are positioned along a same side of the semiconductor package and outside an encapsulant of the semiconductor package.

14. The method of claim 13, wherein the printed circuit board has a first contact which forms a first electrical connection of the component module with a first die pad side of the split die pad and a second contact which forms a second electrical connection of the component module with a second die pad side of the split die pad.

15. The method of claim 13, further comprising mounting a two pole component on the split die pad, wherein a first electrical connection of the two pole component forms an electrical connection with a first die pad side of the split die pad and a second electrical connection forms an electrical connection with a second die pad side of the split die pad.

16. The method of claim 13, wherein the passive components are configured as a circuit.

17. The method of claim 13, wherein the split die pad has a first die pad side and a second die pad side separated by a gap of non-conductive material.

18. The method of claim 13, wherein encapsulating with the encapsulant comprises encapsulating at least a portion of the leadframe.

19. The method of claim 13, further comprising connecting bond wires between the semiconductor die and respective bond pads of the one or more leads and the respective insertion terminals to electrically connect the semiconductor die to the one or more leads and the insertion terminals.

20. The method of claim 13, wherein mounting a component module comprises affixing the component module to the leadframe by a conductive adhesive.

* * * * *